United States Patent
Letavic et al.

(10) Patent No.: US 6,310,378 B1
(45) Date of Patent: Oct. 30, 2001

(54) HIGH VOLTAGE THIN FILM TRANSISTOR WITH IMPROVED ON-STATE CHARACTERISTICS AND METHOD FOR MAKING SAME

(75) Inventors: Theodore Letavic, Putnam Valley; Mark Simpson, White Plains; Emil Arnold, Chappaqua, all of NY (US)

(73) Assignee: Philips Electronics North American Corporation, New York, NY (US)

( * ) Notice: Subject to any disclaimer, the term of this patent is extended or adjusted under 35 U.S.C. 154(b) by 0 days.

(21) Appl. No.: 09/539,911

(22) Filed: Mar. 30, 2000

Related U.S. Application Data (63) Continuation-in-part of application No. 08/998,048, filed on Dec. 24, 1997, now abandoned.

(51) Int. Cl.$^7$ .................................................. H01L 27/01
(52) U.S. Cl. ................................. 257/347; 257/557
(58) Field of Search ................................ 257/347, 557, 257/423, 556; 438/439, 452, 454

(56) References Cited

U.S. PATENT DOCUMENTS

| | | |
|---|---|---|
| 5,246,870 | 9/1993 | Merchant ............................. 437/21 |
| 5,378,912 | 1/1995 | Pein .................................... 257/335 |
| 5,382,818 | 1/1995 | Pein .................................... 257/347 |
| 5,412,241 | 5/1995 | Merchant ............................. 257/409 |
| 5,559,348 | 9/1996 | Watabe ................................ 257/141 |
| 5,648,671 | 7/1997 | Merchant ............................. 257/347 |
| 5,777,365 | 7/1998 | Yamaaguchi et al. ............... 257/347 |
| 5,780,900 | 7/1998 | Suzunki et al. ..................... 257/335 |
| 5,973,341 | * 10/1999 | Letavic et al. ...................... 257/287 |
| 6,023,090 | * 2/2000 | Letavic et al. ...................... 257/347 |
| 6,028,337 | * 2/2000 | Letavic et al. ...................... 257/347 |
| 6,133,591 | * 10/2000 | Letavic et al. ...................... 357/139 |
| 6,191,453 | * 2/2001 | Petruzzello et al. ................ 257/350 |
| 6,232,636 | * 5/2001 | Simpson et al. .................... 257/347 |

* cited by examiner

*Primary Examiner*—Long Pham
*Assistant Examiner*—William David Coleman (57) ABSTRACT

The present invention is directed to an SOI LDMOS device having improved current handling capability, particularly in the source-follower mode, while maintaining an improved breakdown voltage capability. The improvement in current handling capability is achieved in a first embodiment by introducing an offset region between the source and thin drift regions. The offset region achieves an offset between the onset of the linear doping profile and the thinning of the SOI layer that results in the thin drift region. In a second embodiment a further increase in the current handling capability of an SOI device is achieved by fabricating an oxide layer over the offset region, with the thickness of the oxide layer layer varying up to about half the thickness of the oxide layer fabricated over the thin drift region.

9 Claims, 7 Drawing Sheets

HIGH VOLTAGE THIN FILM TRANSISTOR WITH IMPROVED ON-STATE CHARACTERISTICS AND METHOD FOR MAKING SAME

This is a continuation-in-part of application Ser. No. 08/988,048, filed Dec. 24, 1997, abandoned.

I. FIELD OF THE INVENTION

The present invention comprises a high voltage, thin film semiconductor-on-insulator (SOI) device with improved current handling capability when operating in the on-state. In particular, the present invention comprises specific SOI device architectures, and methods for making such devices, that introduce an offset region of varying thickness between the body and thin drift regions that significantly improves the current handling capability of SOI devices.

II. BACKGROUND OF THE INVENTION

The present invention relates to integrated circuit devices which are adapted for high voltage applications and, in particular, integrated circuit devices which are manufactured by the use of semiconductor-on-insulator (SOI) technology and which exhibit improved on-state current handling capabilities while maintaining improved off-state voltage breakdown properties.

Prior high voltage transistors have long been used to switch high voltages. When using these devices, it has been necessary to employ an associated control circuit (preferably an integrated circuit in complex applications) to control the switching function of the high voltage transistor. Associated control circuits typically operate at much lower voltages than high voltage transistors. For many practical reasons, including the difference in operating voltages, low voltage control circuits and high voltage transistors had at one time been fabricated in separate devices.

In order to achieve the related goals of maximum packaging efficiency and total part number reduction, it became desirable to fabricate high voltage transistors and associated control circuits in integrated circuits. Fabrication in single integrated circuits requires that the low voltage sections of these circuits be electrically isolated from the high voltage portions, and that the circuits manifest sufficient current handling capability for the given application.

These requirements concern two distinct operating modes of high voltage transistor integrated circuits—the off-state and the on-state. The off-state performance is measured by breakdown voltage capability. The on-state performance is measured by on-resistance and current handling capability. A first problem encountered in high voltage integrated circuits involved voltage breakdown during the off-state of the device. Such problems were caused by inadequate electrical isolation of various component and subcircuit sections, and such devices were prone to catastrophic voltage breakdown into the on-state.

One such method of electrically isolating components within an integrated circuit is the so-called "dielectric isolation" method. In this method, an electrically insulating material, such as silicon dioxide, is used to isolate the individual components operating at different electric potentials. So-called "silicon-on-insulator" (SOI) technology, where "insulator" refers to silicon dioxide and "silicon" refers to a semiconductor layer deposited atop the insulator layer, is one such example of the dielectric isolation method. In this technology the devices are fabricated in a layer of silicon, approximately 0.1–2 microns thick, which is separated from the silicon substrate by a dielectric layer of silicon dioxide typically 0.1–5 microns thick.

A further improvement to the voltage breakdown capability of high voltage integrated circuits was achieved by introduction of a linear doping profile in the thin drift region between the body and drain regions. U.S. Pat. No. 5,300,448 to Merchant et al., which is hereby incorporated by reference in its entirety, discloses a device architecture and fabrication method that achieves particularly high voltage breakdown capabilities, especially in very thin (less than one micron) SOI films. These devices achieve high breakdown voltage capabilities (>700 volts) during the off-state and would provide an attractive design solution for many high voltage applications were it not for a second limitation encountered in instances where the application requires relatively high current handling capability. The subject matter of the present invention particularly concerns further improvements to devices having very thin (less than one micron) SOI films which overcome this limitation by improving their current-and-power-handling capability.

The problems solved and limitations overcome concern the susceptibility of such devices to pinch-off in the thin film layer adjacent to the body region. This problem is particularly pronounced in thin film SOI devices operating in source-follower (source high) applications. One of the important uses for power transistors is in integrated bridge circuits, which are employed to synthesize waveforms of arbitrary shape and frequency. Typical examples are electronic ballasts and motor drives. In such circuits, the source of the upper of the two switches—the source-follower high-side transistor—has to float above ground potential, and may be biased to the highest voltage in the circuit.

When the source electrode is biased positive (Vs) with respect to the substrate (which is at zero, or ground potential), part of the drift region of the device becomes depleted, thus reducing the cross-sectional area available for current flow, so that the on-resistance increases. Moreover, the silicon substrate acts as an electric-field plate which causes the current to saturate at high drain voltages. The depletion layer within the drift region lowers the magnitude of saturated current.

Increasing layer thicknesses uniformly will not increase the power handling capability of the device since it is only in thin film layers that a linear doping profile increases breakdown voltage capability. Such limitations have heretofore limited the usefulness of thin-film SOI devices where relatively high current handling capability was sought.

III. SUMMARY OF THE INVENTION

It is therefore an object of the present invention to increase the current-and-power-handling capability of a thin film, high voltage, SOI device while maintaining the desirable voltage breakdown properties of the device.

It is therefore another object of the present invention to decrease the on-resistance of a thin film, high voltage, SOI device while maintaining the desirable voltage breakdown properties of the device.

It is therefore a further object of the present invention to increase the current-and-power-handling capability of a thin film, high voltage, SOI device without unacceptably increasing device dimensions.

It is therefore yet another object of the present invention to decrease the on-resistance of thin film, high voltage, SOI devices without unacceptably increasing the device dimensions.

It is therefore a still further object of the present invention to increase the current-and-power-handling capability of a thin film, high voltage, SOI device when the device is operating in the source follower mode.

It is therefore an object of the present invention to decrease the on-resistance of a thin film, high voltage, SOI device when the device is operating in the source follower mode.

It is therefore another object of the present invention to provide a thin film, high voltage, SOI device that has improved current-and-power-handling capability and is economical to manufacture.

It is therefore a further object of the present invention to provide methods for fabricating thin film, high voltage, SOI devices that have improved current-and-power-handling capabilities. It is therefore yet another object of the present invention to provide methods for fabricating thin film, high voltage, SOI devices that have decreased on-resistance.

It is therefore a still further object of the present invention to provide methods for fabricating thin film, high voltage, SOI devices that have improved current-and-power-handling capability when operating in the source follower mode.

It is therefore an object of the present invention to provide methods for fabricating thin film, high voltage, SOI devices that have decreased on resistance when operating in the source follower mode.

The problems encountered in the prior art have been solved in embodiments of the present invention by modifying the architecture of thin film SOI devices. It has been found that offsetting the thinning of the drift region in an LDMOS device with respect to the onset of the linear doping profile in the drift region significantly improves the source-follower current flow of the device, while maintaining the desirable voltage breakdown properties of the device. It also has been found that forming an oxide layer over this offset region that varies up to about half the thickness of the adjacent insulating layer formed over the thin drift region further improves the source follower current handling capability of the device, while yet maintaining the desirable voltage breakdown properties of the device.

In a first embodiment of the present invention, the thin film SOI device with improved source follower current handling capability comprises an SOI layer deposited over a silicon substrate. In lateral sequence a source region, a body region, an offset region, a drift region and a drain region are formed in the SOI layer. Fabricated above the drift region is an oxide layer. A linear doping profile is provided in the offset and drift regions to provide a high breakdown voltage capability. Introduction of an offset region between the body and thin drift regions by offsetting the thinning of the drift region with respect to the offset of the linear doping profile significantly decreases depletion effects encountered in prior thin film SOI devices and thereby significantly increases the current-and-power-handling capability of the device, while maintaining the desirable voltage breakdown properties of the device.

In a second embodiment of the present invention a thin film SOI device with improved source follower current handling capabilities likewise comprises an SOI layer deposited over a silicon substrate. In lateral sequence a source region, a body region, an offset region, a drift region and a drain region are formed in the SOI layer. Fabricated above the offset region and drift regions are oxide layers. The thickness of the oxide layer above the offset region varies up to about half the thickness of the oxide layer over the drift region. A linear doping profile is provided in the offset and drift regions to provide a high breakdown voltage capability for the device. Fabrication of an oxide layer over the offset region allows the lateral extent of the offset region to be further increased, thereby further improving the source follower current handling capability of the device, while still maintaining the desirable breakdown voltage properties of the device.

The methods of the present invention that accomplish an improvement in the source-follower current handling capability of the SOI device include fabrication techniques that comprise additional fabrication steps that introduce an offset region in the thin film SOI layer between the body region and the thin drift region. These fabrication steps have the effect of displacing the onset of the drift region thinning with respect to the onset of the linear doping profile. Additional methods of the present invention comprise fabrication steps that form an oxide layer over the offset region having a thickness of about half the oxide layer thickness deposited over the thin drift region. Fabrication of an oxide layer over the offset region allows the lateral extent of the offset region to be increased, thereby further increasing the source-follower current handling capability of the device without degrading the breakdown voltage capability of the device.

IV. BRIEF DESCRIPTION OF THE DRAWINGS

The above and other objects and advantages of this invention will be apparent upon consideration of the following detailed description, taken in conjunction with the accompanying drawings in which.

V. DETAILED DESCRIPTION OF THE PREFERRED EMBODIMENTS

A. Prior Art

Figure 1:
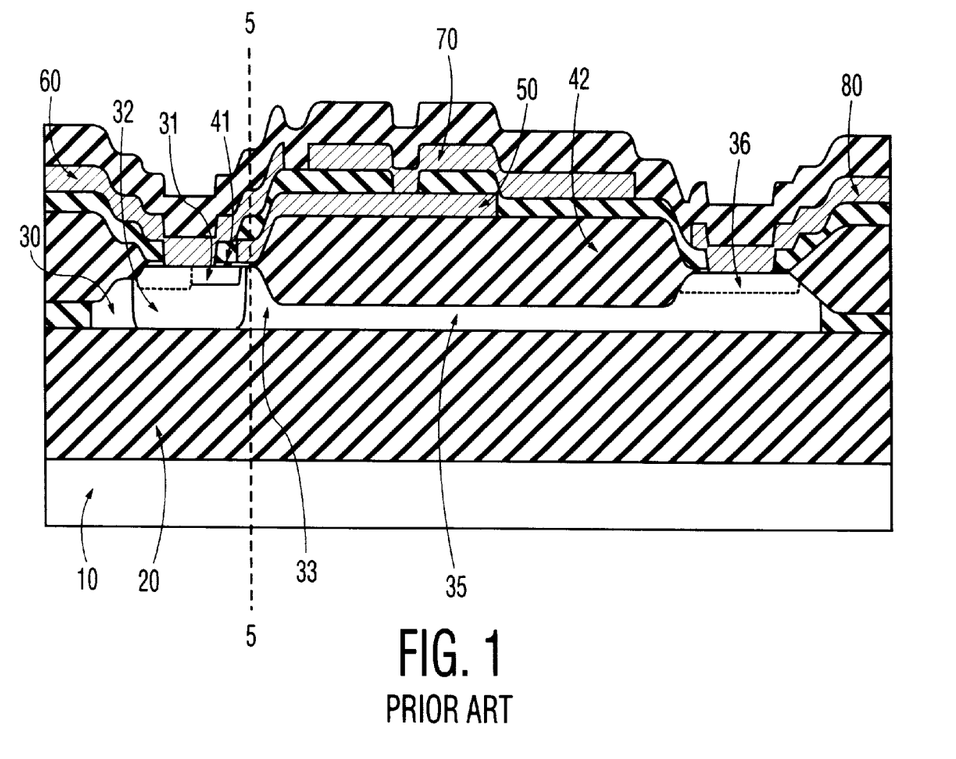
FIG. 1 is a cross-sectional view of a prior art thin film, high voltage, SOI transistor.

FIG. 1 depicts a prior art high voltage SOI LDMOS transistor made according to the prior art. The transistor comprises a substrate 10, an oxide layer 20, an epitaxial film layer 30, a source electrode 60, a gate electrode 70 and a drain electrode 80.

Starting with the source region 31, the thin film layer 30 further comprises in lateral sequence from left to right a source region 31, a body region 32, a thin drift region 35 and a drain region 36. The thin drift region 35 extends for a length L, starting at the origin indicated by reference line 5 and extending to reference line 7. Formed above thin film layer 30 are a gate oxide layer 41 and a drift region insulating layer 42. Fabricated above the gate oxide 41 and drift region insulating 42 layers is a polysilicon gate 50. In order to achieve a high breakdown voltage capability, the drift region 35 is thinned to less than 1 micron and a linear doping profile is introduced into the drift region. The doping profile varies from a minimum in the region 33 near to the body region 32 to a maximum in the drift region adjacent to the drain region 34. The onset of the linear doping profile in the device of FIG. 1 coincides with the thinning of the SOI layer 30 that creates the thin drift region 35, both starting at the origin indicated by reference line 5. This configuration is capable of achieving a high breakdown voltage capability (>700 volts). However, in a source-follower mode, depicted in FIG. 2, the prior art device encountered problems.

Figure 2:
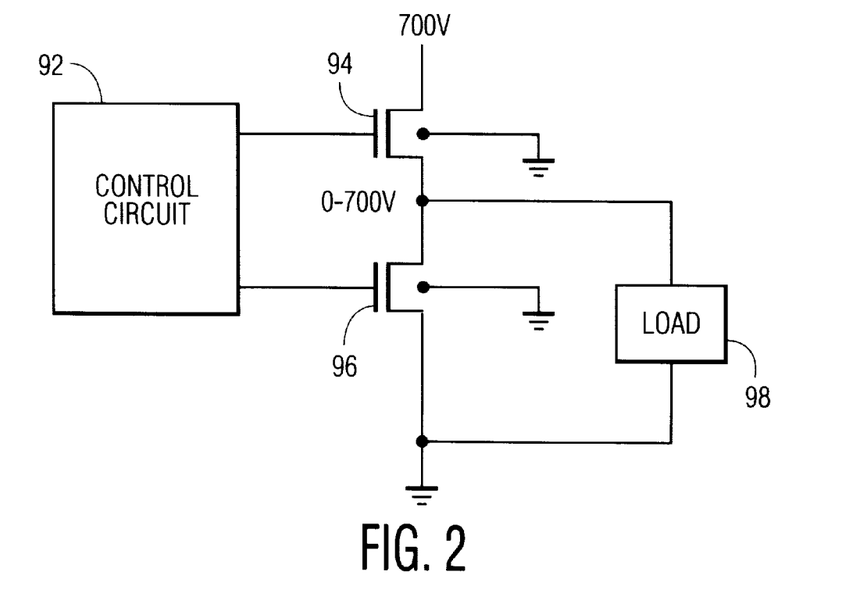
FIG. 2 depicts in plan view a typical half-bridge circuit comprising a pair of thin film, high voltage, SOI transistors, one of which is operating in a source-follower mode.

FIG. 2 depicts a typical integrated half bridge circuit that includes two power transistors on the same chip. This circuit comprises a control circuit 92, a source follower transistor 94, a common-source transistor 96, and a load 98. In this circuit, the source node of the source follower transistor 94 can be biased up to 700 volts depending on operating conditions.

Figure 5:
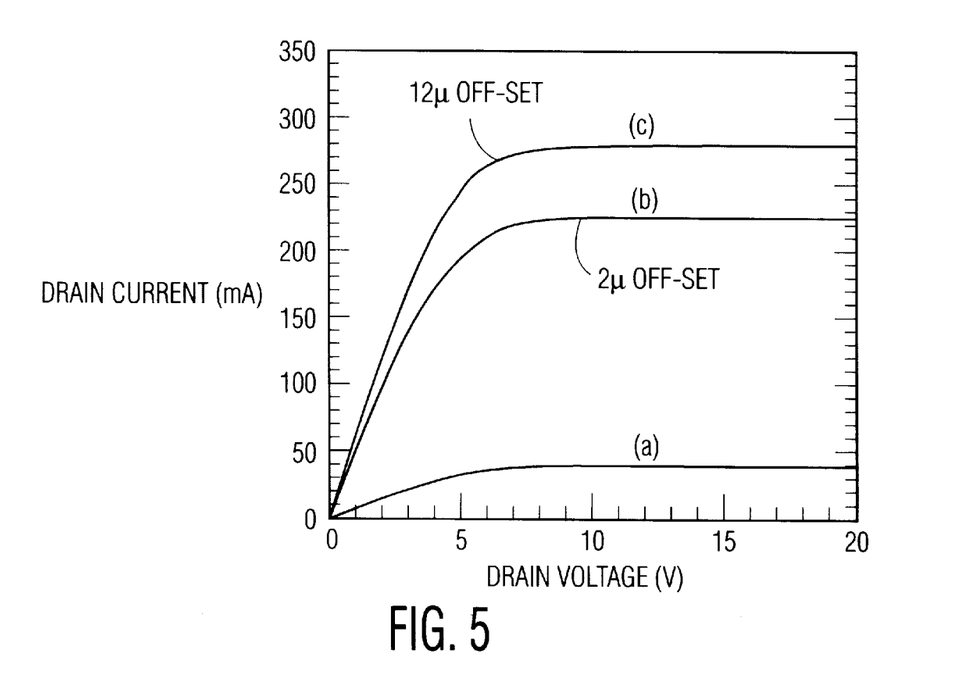
FIG. 5 depicts a graph of the drain current versus drain voltage for the two embodiments of the present invention depicted in FIGS. 3 and 4 in comparison to the prior art device depicted in FIG. 1.

When the source electrode is biased positive (Vs) with respect: to the substrate (which is at ground or zero potential), a portion 33 of the drift region 35 adjacent to the body region 32 of the device becomes depleted, thus reducing the cross-sectional area available for current flow, with the result that the on-resistance increases. Moreover, the silicon substrate acts as an electric field plate, which causes the current to saturate at high drain voltages. The depletion layer within the drift region lowers the magnitude of the saturated current. Curve (a) of FIG. 5 depicts the drain current vs. drain voltage characteristic for a device made in accordance with the prior art and shows the relatively poor current handling capability of the device. The present invention solves these problems and thereby improves the current handling capability of these devices in the following manner.

B. First Embodiment

Figure 3:
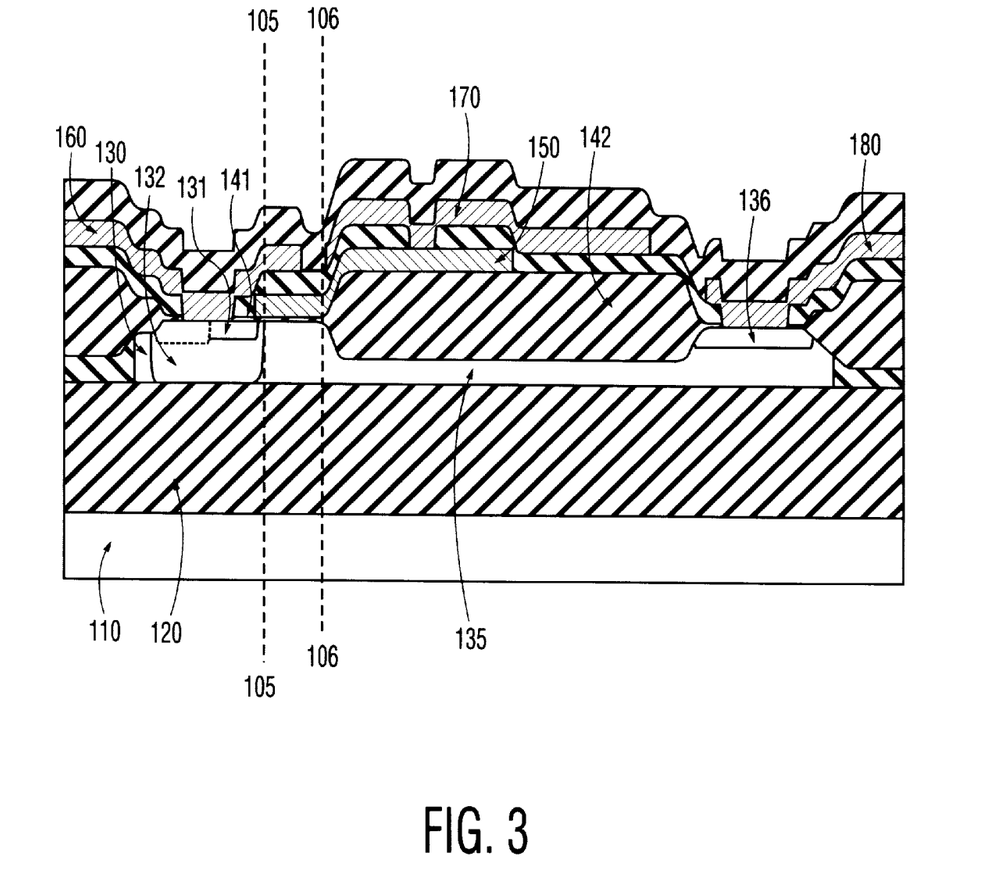
FIG. 3 depicts a cross-sectional view of a first embodiment of the present invention.

FIG. 3 depicts a first embodiment of the present invention. The transistor comprises a substrate 110, an oxide layer 120, an epitaxial film layer 130, a source electrode 160, a gate electrode 170 and a drain electrode 180. Starting with the source region 131, the thin film layer 130 further comprises in lateral sequence from left to right a source region 131, a body region 132, an offset region 134, a drift region 135 and a drain region 136. The drift region 135 extends for a lateral length L, starting at the origin indicated by reference line 105 and extending to reference line 107. Offset region 134 extends for a lateral length D, from reference line 105 to reference line 106.

Formed above thin film layer 130 are a gate oxide layer 141 and a drift region insulating layer 142. Fabricated above the gate oxide layer 141 and drift region insulating layer 142 layers is a polysilicon gate 150. In FIG. 1, the onset of the drift region thinning and the onset of the linear doping profile coincided at origin 5. In the device of FIG. 3, while the linear doping profile begins at origin 105, the onset of the drift region thinning does not coincide with the origin 105, but instead is offset by a distance D, representing the lateral distance between reference line 105 and reference line 106.

By introducing an offset region 134 having a thickness greater than the thin drift region 135, the cross-sectional area available for current flow adjacent to the body region 132 is significantly increased over the device of FIG. 1.

The introduction of an offset region 134 results in a significant increase in the source-follower saturated current flow, as shown in curve (b) of FIG. 5 for a 2 micron offset, without compromising the high voltage breakdown properties of the SOI device structure. This results in a device which can deliver high power levels to a load in the source-follower mode. This device structure can be used over a wide voltage (hence application) range, e.g., up to 1100 V. In this voltage range, typical device dimensions are: SOI layer thickness: 0.25 to 1.5 microns; buried oxide thickness: 1.0 micron to 6.0 microns; offset region length D: 2 to 6 microns; offset region thickness $T_{offset}$: 1.0 to 1.5 microns; drift region length L: 10.0 microns to 100.0 microns; drift region thickness $T_{drift}$: 0.2 to 0.5 microns.

The high breakdown voltage capability of the device is achieved by introducing a linear doping profile in the offset 134 and thin drift 135 regions. This profile varies from a minimum in the offset region 134 adjacent to the body region 132 to a maximum in the thin drift region adjacent to the drain region 136. The doping profile optimally varies in accordance with the following formula where Q(0) is the minimum doping value; X is the lateral distance from the reference origin 105; L is the length of the thin drift region; and D is the length of the offset region:

$$Q(X)=Q(0)+(X/(L+D))Q_{max}$$

Typical values for Q(0) are in the range of $6\times10^{11}$ cm$^{-2}$ to $1.5\times10^{12}$ cm$^{-2}$, while typical values for $Q_{max}$ are in the range of $1.4\times10^{13}$ cm$^{-2}$ to $3.4\times10^{13}$ cm$^{-2}$.

The improved source-follower current handling capability of the device of FIG. 3 in contrast to the device of FIG. 1 is achieved by offsetting the drift region oxide layer mask with respect to the linear doping profile mask by a distance D. As a result, the SOI layer 130 in offset region 134 is thicker and of greater lateral extent than the corresponding region 33 of the device of FIG. 1 that is adjacent to the body region 32. The difference in thicknesses means that for any background charge level Q, the volume doping concentration of the offset region 134 of the device of FIG. 3 will be lower than that for the thin drift region 33 immediately adjacent to the body region 32 of the device of FIG. 1.

Carrier mobility is a function of volume doping concentration, and mobility decreases as the volume doping level increases. Since the mobility in the offset region 134 of the device of FIG. 3 is higher than that for the thin drift region 33 immediately adjacent to the body region of the device of FIG. 1 for any background charge level, the ohmic current flow must be larger. Thus the offset region construction increases the saturation current flow in both source-low and source-high bias modes.

The effect of the offset region construction is more significant in the source-high bias mode. As the respective source regions of the devices of FIGS. 1 or 3 are biased above that of the substrate wafer, a depletion and inversion layer is formed in the region 33 of the device of FIG. 1 and in the offset region 134 of the device of FIG. 3. The device of FIG. 1 is particularly susceptible to the formation of a depletion layer because of its relative layer thinness in comparison to the thicker offset region 134 of the device of FIG. 3. The depletion layer formed in the device of FIG. 1, as a result, substantially reduces the cross-sectional area available for current flow in region 33 of the device of FIG.

1, thereby substantially decreasing the saturation current flow of the device.

The relative effect of increasing layer thickness can be determined by treating the offset region 134 of FIG. 3 as a voltage-controlled resistor. The saturated current density then can be expressed as:

$$J_{sat} \sim q\, v_{sat}(t_{soi}-w)Q/q\, t_{soi} \qquad (1)$$

where Q is the background charge level, $t_{soi}$ is the SOI layer thickness in the offset region 134 or region 33, $v_{sat}$ is the saturated velocity and W is the depletion layer width from the substrate MOS capacitor due to the source-follower bias. The maximum depletion layer width at any point can be expressed as:

$$W(x)=[(4\, \text{esi}\, t_{soi}(x)\, Vf(x)/Q(x))]^{1/2} \qquad (2)$$

where Vf is the Fermi potential along the SOI/buried oxide interface. Since $J_{sat}$ is proportional now to $t_{soi} - T_{soi}^{1/2}$, an increase in SOI layer thicknesses, represented by the relative thickness difference between the offset region 134 of the device of FIG. 3 and the thickness of region 33 of the device of FIG. 1 will increase $J_{sat}$. The $t_{soi}$ in the offset region 134 of FIG. 3 should be greater than the maximum depletion width from the MOS capacitor, and the thicker $t_{soi}$ the larger the saturation current.

Thus it has been demonstrated that increasing the SOI layer thickness by offsetting the drift region oxide layer mask with respect to the origin of the linear doping profile improves the source-low and source-high ohmic and saturation current density. The maximum length of offset which can be used is determined by to average lateral electric field in the device structure.

As shown, the saturation current density is directly proportional to the background charge level in the offset region. Increasing the background doping level will result in significant increases in saturation current, as the ohmic conduction increases, and the net effect of the depletion region from the substrate MOS at source-high bias is smaller, resulting in a larger cross-section for current flow.

C. Second Embodiment

Figure 4:
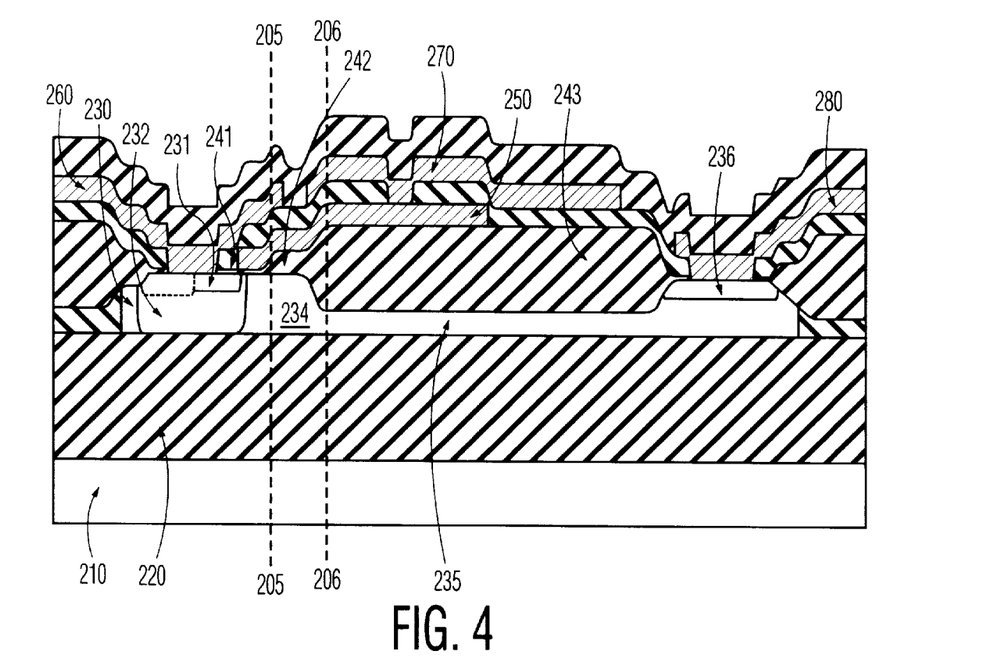
FIG. 4 depicts a cross-sectional view of a second embodiment of the present invention.

FIG. 4 depicts a second embodiment of the present invention. The transistor comprises a substrate 210, an oxide layer 220, an epitaxial film layer 230, a source electrode 260, a gate electrode 270 and a drain electrode 280. Starting with the source region 231, the thin film layer 230 further comprises in lateral sequence from left to right a source region 231, a body region 232, an offset region 234, a drift region 235 and a drain region 236. Formed above thin film layer 230 are a gate oxide layer 241, an offset region oxide layer 242 and a drift region insulating layer 243. Fabricated above the gate oxide layer 241, offset region oxide layer 242 and drift region insulating 243 layers is a polysilicon gate 250. Like the device of FIG. 3, while the linear doping profile begins at 205, the onset of the drift region thinning does not coincide with the origin 205, but is offset by a distance D measured by the distance between reference line 205 and, reference line 206. Like the first embodiment depicted in FIG. 3, the introduction of an offset region thicker than the thin drift region increases the area available for current flow adjacent to the body region.

A further increase in the current handling capability of the SOI LDMOS thin film architecture is accomplished by fabricating an additional oxide layer 242 over the offset region. By fabricating an oxide layer 242 over the offset region such that the oxide layer has a thickness varying up-to about one-half the thickness of the oxide layer 243 deposited over the drift region, a further increase in the lateral extent of the offset region can be introduced without a decrease in the breakdown voltage capability of the device. The current characteristic for a device having a 12 micron, long offset region is shown by curve (c) in FIG. 5, and demonstrates the substantial benefit of the combination of an offset region and an oxide layer. Typical device dimensions are: D=2 to 12 microns; $T_{offset}$=0.75 to 1.0 microns; L=10 to 100 microns; and $T_{drift}$=0.2 to 0.5 microns. Typical thicknesses for the offset region oxide layer and drift region oxide layer are 1.0 to 1.5 microns and 2.0 to 3.0 microns, respectively.

Two-dimensional oxidation techniques can be used to further smooth out the oxide transition regions between the drift region oxide layer and offset region oxide layer. The device, as a result, has an improved structure that more nearly approximates an ideal gated diode structure. The offset region significantly improves the on-state characteristics (on-resistance and maximum current), and the offset region oxide layer improves the breakdown voltage of the offset structure.

Growing an oxide layer 242 over the offset region 234 has beneficial effects for the following reasons. As the offset region is increased in lateral extent towards the drain, the total electric field in the offset region is increasing. For certain combination of backgound doping and lateral offset length, breakdown of the device structure in the offset region is probable, as the vertical path in the offset region is contributing to the total ionization path. In order to reduce the probability of lowering the breakdown voltage due to the construction of the offset region, a silicon dioxide layer 242 is grown on top of the offset silicon to thin this region down. This thinning (oxide growth) has the following effects on voltage handling.

First, thinning the SOI layer in the offset region reduces the contribution of a vertical breakdown path, thus the addition of the offset region does not degrade the breakdown voltage. Second, growth of an oxide which is a significant portion of the drift region oxide layer thickness shapes the electric field in this region of the device, thus rounding off the electric field peaks which can increase the breakdown voltage. This forms a structure that more nearly approximates an ideal gated diode structure. Third, growing a thick oxide in the offset region can be used to remove defects which remain from the formation of the drift region oxide layer, thus significantly improving gate oxide integrity.

D. Fabrication Methods

The structure of FIG. 4 for a device having an offset region 6 microns long, a drift region approximately 44 microns long, and a breakdown voltage of 700 volts may be manufactured employing techniques used to fabricate lateral MOS transistors, as follows. The following description is for a device optimized to achieve a breakdown voltage of 700 volts, and has a 3 micron thick buried oxide layer and 0.5 micron thick SOI layer. The starting SOI layer 230 is obtained by any of the standard techniques, such as, for example, zone melt recrystallization or direct bonding, is formed on the silicon substrate 210 with a buried oxide layer 220 interposed between the substrate 210 and the SOI layer 230. The silicon substrate 210 may be either n-type or p-type material. The SOI layer 230 has thickness less than 1.5 microns and resistivity greater than 0.1 ohm-cm. It may be fabricated from n-type or p-type material, but for the purposes of description it will be assumed that n-type material has been used.

Figure 6:
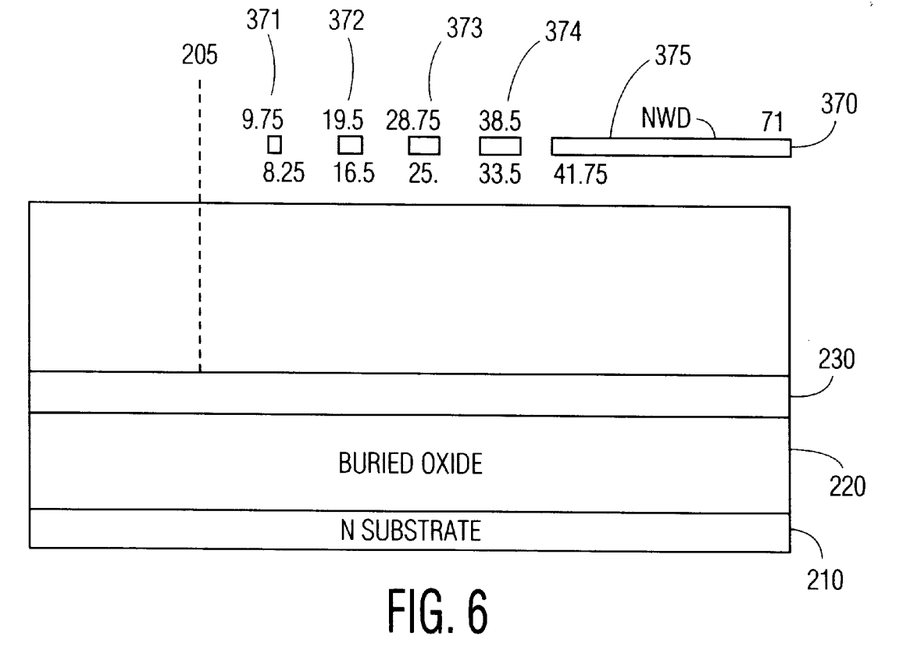
FIG. 6 depicts the fabrication step in which a linear lateral charge profile is implanted in the SOI layer.

The linear doping profile of the offset and drift region 234, 235 is introduced into the SOI layer 230 by ion implantation through a segmented mask 370 depicted in FIG. 6. The mask 370 is displaced vertically for clarity. The origin of the mask 370 coincides with reference origin 205, and may be formed by a photoresist layer patterned photolithographically by standard techniques. Thereafter phosphorous ions are implanted at an energy of 160 KeV. The photoresist mask 370 is provided with five openings of varying dimensions to enable the phosphorous ions to be implanted into the silicon layer 230 at varying amounts. The five openings in the photoresist mask with reference to origin 205 have their beginning and ending endpoints as follows: opening 371 begins at 8.25 microns and ends at 9.75 microns; opening 372 begins at 16.5 microns and ends at 19.5 microns; opening 373 begins at 25 microns and ends at 28.75 microns; opening 374 begins at 33.5 microns and ends at 38.5 microns; and opening 375 begins at 41.75 microns and ends at 71 microns. These five openings have different lateral dimensions with the opening increasing in size from left to right. For the given dimensions the first opening 371 is 1.5 microns wide;, the second opening 372 is 3.0 microns wide; the third opening 373 is 3.75 microns wide; the fourth opening 374 is 5.0 microns wide; and the fifth opening 375 is 28.25 microns wide. For a drift region length of 44 microns, the lateral electric field should be approximately 15 V/micron. This specifies an implant dose of $Q_{max}$ of to be on the order of $1.4-1.6\times10^{13}$ cm$^2$. The minimum doping in the SOI drift region, (background doping in the SOI starting material plus implanted species) should be less than $1.5\times 10^{12}$ cm$^{-2}$ n-type.

To achieve a uniform lateral doping profile using the above photoresist mask openings the thermal diffusion length should follow the relationship of $(Dt)^{1/2}=cc/2$, where cc is the center-to-center spacing of the photoresist mask window openings (9.0 microns in this case), and $(Dt)^{1/2}$ is the diffusion length at diffusion temperature of the implanted species. This is accomplished by removing the photoresist layer 370 after the ion implantation is carried out, and capping the wafer with a 0.14 micron thick silicon nitride layer and annealing. The annealing may be carried out for various time periods, at about 1,150° C. The time period must be long enough to assure a monotonic increase in doping concentration from left to right. This combination of mask, ion implant, and anneal assures the approximate linear variation of phosphorous doping in the offset 234 and the drift 235 regions of the SOI layer 230. This linear lateral doping profile is a key feature responsible for improved breakdown voltage values achieved in the device.

Figure 7:
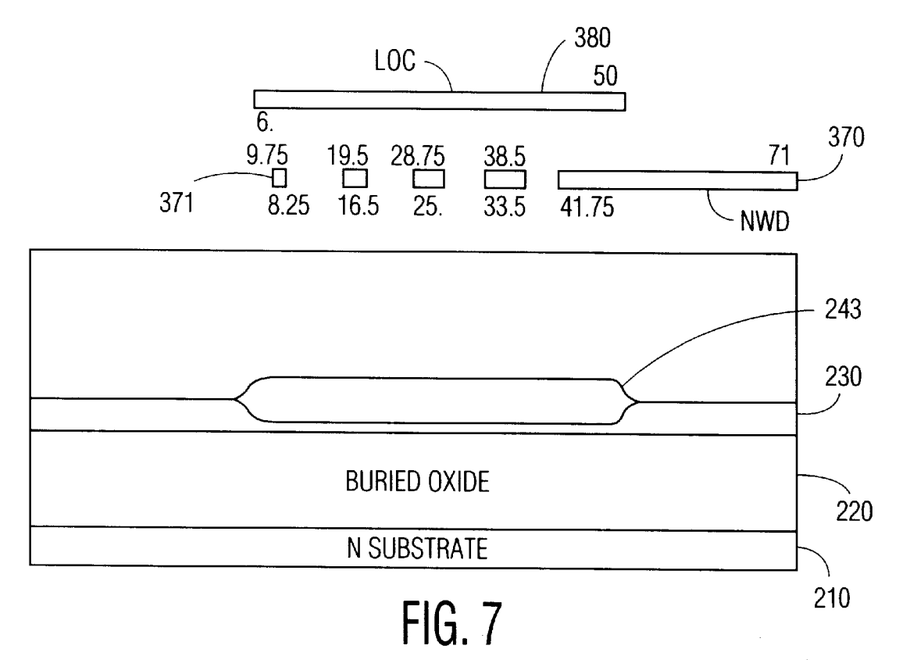
FIG. 7 depicts the fabrication step in which an oxidation layer is grown over the drift region.
Figure 8:
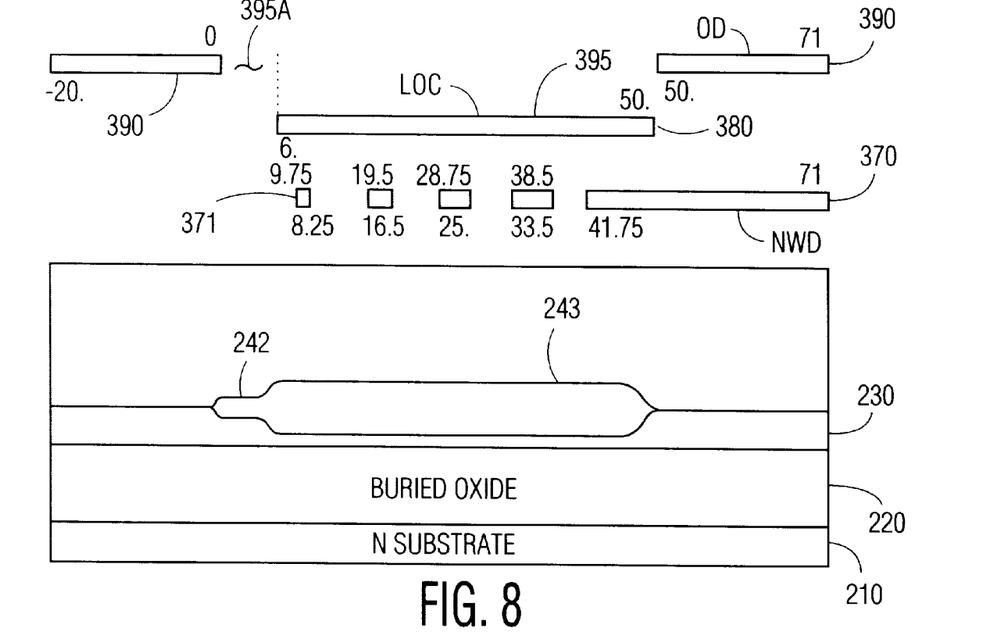
FIG. 8 depicts the fabrication step in which an oxide layer is grown over the offset region.

The offset region oxide layer 242 and drift region oxide layer 243 are selectively grown using the industry standard LOCOS process; (Local Oxidation of Silicon), and the steps are depicted in FIGS. 7–8. A detailed description of the development of the LOCOS process is provided by "The Invention of LOCOS," E. Kooi, IEEE, New York, N.Y., 1991, which is hereby incorporated by reference. A brief description of a typical LOCOS processes as applied to SOI is described below.

A 0.06 micron pad (wet) oxide is grown on the surface of the SOI layer, and a LPCVD silicon nitride layer is deposited onto the pad oxide to a thickness of 0.14 micron. The nitride layer (not shown) is patterned using photolithographic masks and reactive ion etching processing, and the photoresist is removed. This leaves an opening 380 in the nitride layer. The boundaries of opening 380 are indicated with reference to origin 205, as are the boundaries of the other masking steps depicted in FIGS. 8–11. A diffusion clean (RCA clean with HF) is used prior to high temperature diffusion. The drift region oxide layer 243 is grown at 1050° C. with the diffusion time specified to result layer in a layer thickness on the order of 2.2 microns. Similar steps are performed to form the offset region oxide layer 242, resulting in a suitably etched nitride layer 390 having a gap 395. As depicted in FIG. 8, a portion of this gap 395a extends beyond the drift region insulating layer 243 formed in the previous step, leaving the SOI layer 230 exposed in the region where the offset region oxide layer 242 is grown. The offset region oxide layer 242 is grown to a thickness of 1.0 micron. A buffered HF dip is used to remove any surface oxide which may have grown on the silicon nitride layer, and the nitride layer is removed with either reactive ion etching or wet chemical processing.

Prior to gate oxidation, a sacrificial oxidation is performed to remove any defects which may be present in the areas of the LOCOS step edge. These are referred to as "white ribbon" or "black belt" defects, and occur due to lateral nitridization of the silicon surface during the LOCOS oxidation. The severity of this defect is directly related to the total amount of oxide layer growth during the LOCOS process. The defects associated with the drift region oxide layer growth are more numerous and severe than those associated with the offset region oxide layer growth. To remove the defects, the pad oxide layer is stripped off with an HF solution, and a 0.1 micron or less wet (or dry) thermal oxide is grown on the surface of the SOI. This oxide is subsequently stripped off (hence sacrificial) and standard gate oxide processes can be employed.

The degree of nitridation is much worse for the drift region oxide layer growth 243 due to the fact that its oxidation thermal cycle is four times longer than for the offset region oxide layer 242. The second embodiment of this invention depicted in FIG. 4 which uses the offset region oxide layer growth 242 along with the drift region growth leads to much more robust gate oxide performance. The reason for this is the sacrificial oxidation is not always successful at removing the defects due to the drift region oxide layer growth, and the offset region oxide layer growth following the drift region oxide layer growth is very effective at removing the nitrided defect structure. Since the defect density is very small for the offset region oxide layer growth, the sacrificial oxide is very effective in removing the offset region oxide layer nitrided defects.

Figure 9:
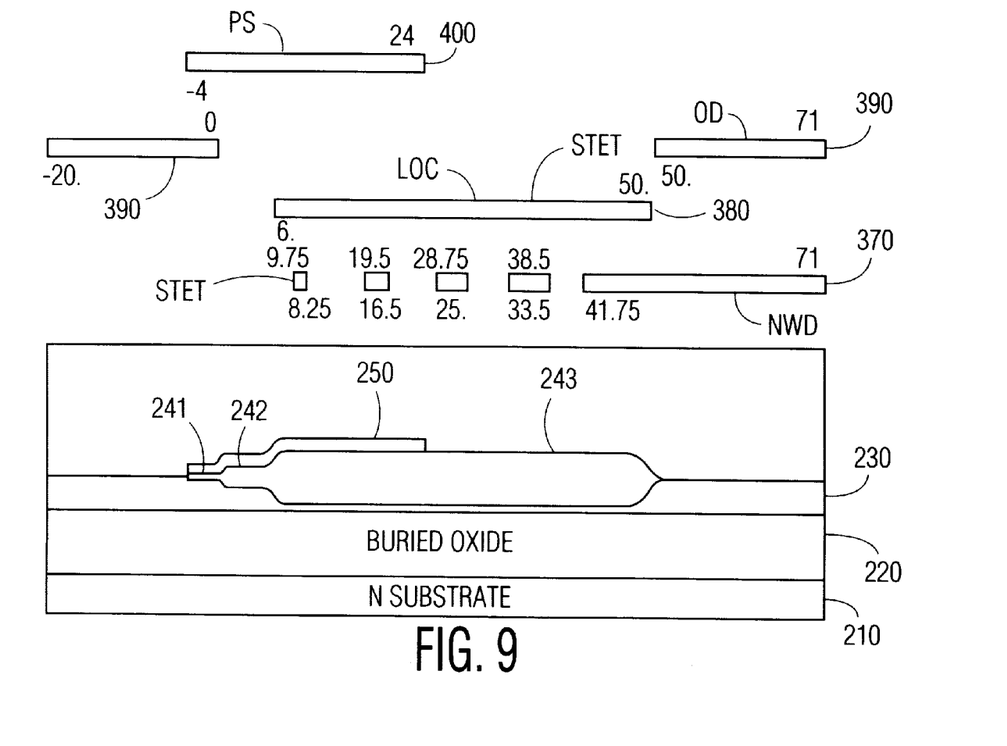
FIG. 9 depicts the fabrication step in which a polysilicon gate is fabricated in the device.

A 0.06 micron gate oxide layer 241 is grown over the surface of the wafer as depicted in FIG. 9. A photoresist mask 400 (again, all masking steps are vertically displaced for clarity, and previous steps are retained to illustrate the dimensional and spatial relationships among the steps) is provided to form the polysilicon layer. A layer of polysilicon 250 approximately 0.5 micron thick is deposited and the unmasked portion of this layer extending beyond the region represented by mask 400, is removed by reactive ion etching. The photoresist mask 400 is then removed, and a 0.03 micron layer of silicon dioxide (not shown) is grown on the polysilicon gate 250.

Figure 10:
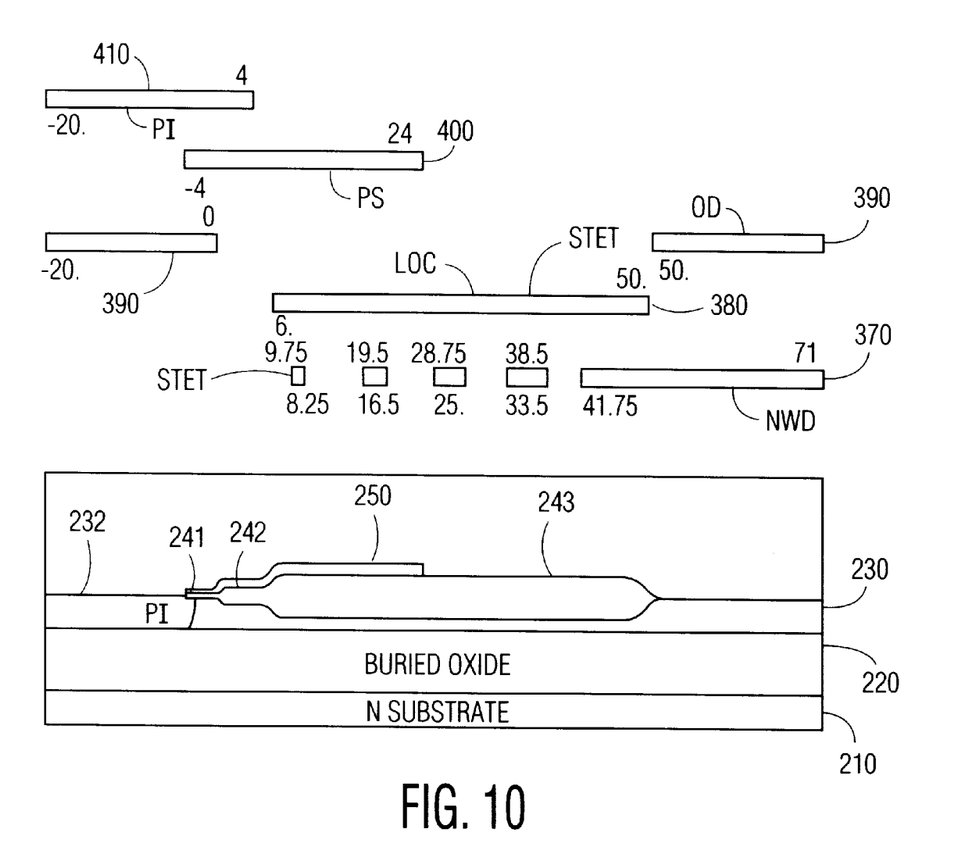
FIG. 10 depicts the fabrication step in which a PI channel implant is performed.

As depicted in FIG. 10, a P-body region 232 is formed by implanting boron ions at an energy of 40 KeV and dose of about $3.0\times10^{13}$/cm$^2$ in the region 232 through a photoresist mask 410. This photoresist mask 410 is positioned such that the implantation is self-aligned to the polysilicon gate 250. After stripping this photoresist, the wafer is annealed at 1100° C. for 340 minutes to drive boron to the buried oxide layer 220 and form a channel region of about 1.5 microns width.

Thereafter, the source region 231 and the drain region 236 are formed by implanting arsenic ions with an energy of 190

KeV at a dose of about $5\times10^{15}/cm^2$ using mask 420. Next, the p-type body contact is formed by implantation of boron at a dose of $5\times10^{15}/cm^2$, using mask 430. The arsenic ions provide N+ source 231 and drain 236 regions. After stripping the photoresist, the wafer is annealed at 950° C. for approximately 30 minutes.

Figure 11:
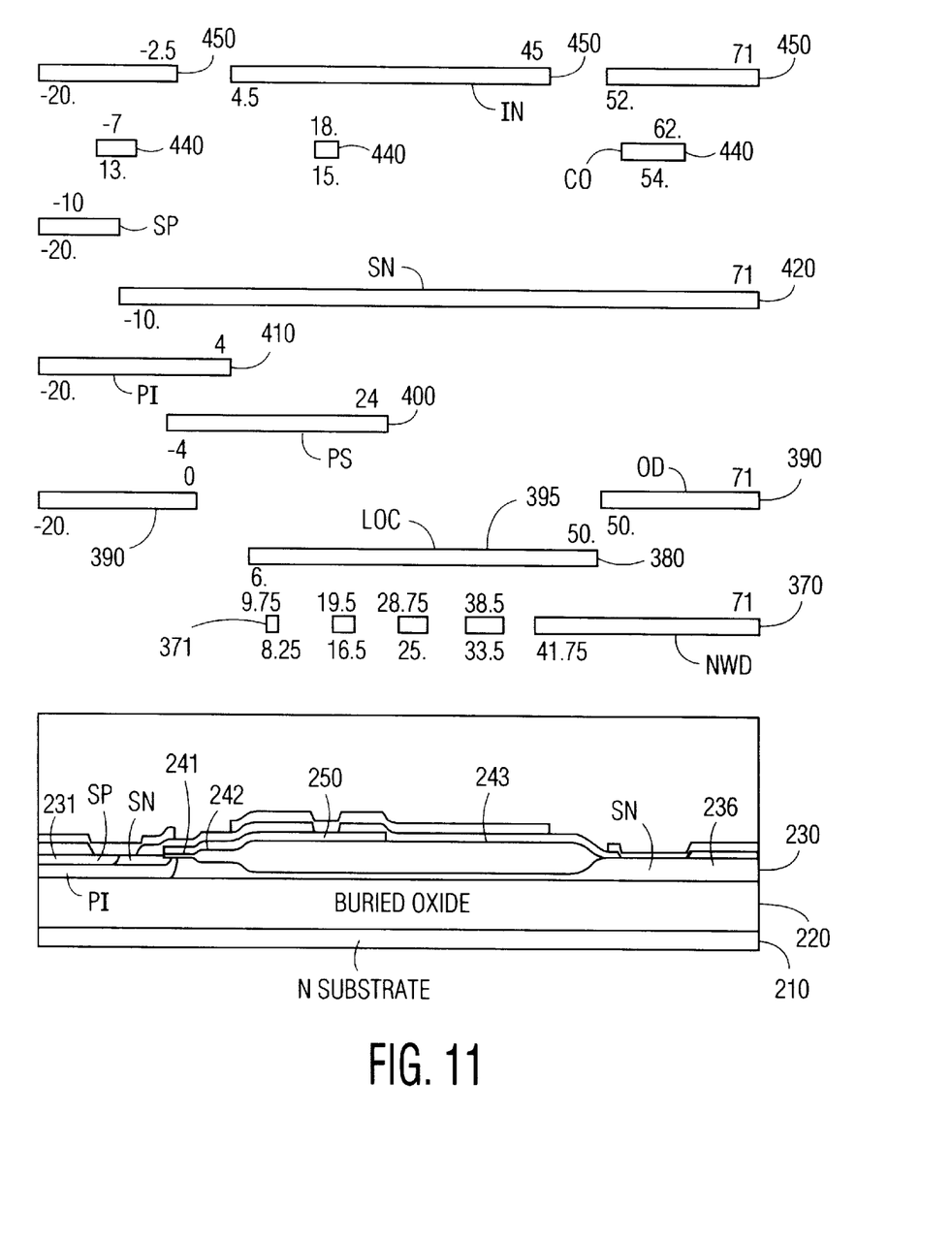
FIG. 11 depicts the fabrication step in which source and drain regions are formed in the device.

A silicon dioxide layer having about 8% per cent phosphorous is deposited onto the wafer at a thickness about 1.3 microns. The layer is masked with a photoresist having openings 440, as depicted in FIG. 11, to expose only regions where the aluminum contacts are desired for the source region 231, gate region 250, and drain region 236. The openings 440 to regions 231, 250, and 236 are provided by reactive ion etching and thereafter the photoresist is stripped. The wafer is annealed at approximately 1000° C. for 30 minutes to smooth the etched silicon dioxide layer to allow aluminum coverage. Any residual silicon dioxide is removed from the contact areas and a 1.2 micron layer of aluminum having 1% per cent silicon and resistance of 25 ohm-cm$^2$ is deposited. By appropriate masking the regions 260, 270, and 280 are formed by reactive ion etching. The wafer is annealed at 407° C. for 30 minutes after stripping and masking.

A final step of this method involves the deposition of a protective layer (not shown) of silicon dioxide having a 6% per cent phosphorous doping, for example, at a thickness of 1.2 microns, or a layer of plasma-deposited silicon nitride. Pad areas can be provided to make external electrical connections to the several electrodes 260, 270, and 280.

Thus it is seen that thin film, high voltage, SOI device architectures having improved current-and-power handling capabilities, particularly in the source follower mode, and methods for fabricating these devices, are provided. One skilled in the art will appreciate that the present invention can be practiced by other than the described embodiments; these have been presented for the purposes of illustration and not of limitation; and the present invention is therefore limited only by the claims that follow.

We claim:

1. A high voltage, semiconductor-on-insulator electronic device, comprising:

a substrate;

a buried oxide layer formed on the substrate, the buried oxide layer having a buried oxide layer thickness;

a semiconductor layer formed on the buried oxide layer, wherein the semiconductor layer further comprises in lateral sequence a source region, a body region, an offset region, a thin drift region and a drain region;

a drift region insulating layer formed on the drift region next to the gate oxide layer;

a further insulating layer formed on the source, body and offset regions next to the drift region insulating layer, which further insulating layer forms a gate oxide layer on at least the source and body regions;

a gate region formed on the further insulating layer and a portion of the drift region insulating layer;

the drift region having a lateral length L and the offset region having a lateral length D; the length L+D approximately describing the lateral distance between the body and drain regions; the drift region having a thickness $T_{drift}$, and the offset region having a thickness $T_{offset}$, both thicknesses $T_{drift}$ and $T_{offset}$ substantially perpendicular to said lateral dimension of said semiconductor layer; the thickness of the offset region $T_{offset}$ being thicker than the thickness of the drift region $T_{drift}$; and the semiconductor layer having a substantially linear doping profile between the body and drain regions, from a minimum value in the offset region adjacent to the body region, to a maximum value in the thin drift region adjacent to the drain region.

2. The high voltage, semiconductor-on-insulator electronic device of claim 1 wherein the drift region length L is substantially in the range of 10 to 100 microns; the offset region length D is substantially in the range of 2 to 6 microns; the buried oxide layer has a thickness substantially in the range of 1 to 6 microns; the thickness of the drift region $T_{drift}$ is substantially in the range of 0.2 to 0.5 microns; and the thickness of the offset region $T_{offset}$ is substantially in the range of 1.0 to 1.5 microns.

3. The high voltage, semiconductor-on-insulator electronic device of claim 1, wherein the substantially linear doping profile of the semiconductor layer is described at any point approximately X microns distant from the body region by the relationship:

$$Q(X)=Q(0)+(X/(L+D))Q_{max}$$

where Q(0) is the minimum number of dopant ions per unit area in the offset region adjacent to the body region, and $Q_{max}$ is the maximum number of dopant ions per unit area implanted in the drift region.

4. The high voltage, semiconductor-on-insulator electronic device of claim 3, wherein Q(0) is substantially in the range of $6\times10^{11}/cm^2$ to about $1.5\times10^{12}/cm^2$; and $Q_{max}$ is substantially in the range of $1.4\times10^{13}/cm^2$ to about $3.4\times10^{13}/cm^2$.

5. The high voltage, semiconductor-on-insulator electronic device of claim 1, wherein the further insulating layer comprises the gate oxide layer formed on the source and body regions, and comprises an offset region insulating layer formed on the offset region next to the gate oxide layer.

6. The high voltage, semiconductor-on-insulator electronic device of claim 5 wherein the drift region length L is substantially in the range of 10 to 100 microns; the offset region length D is substantially in the range of 2 to 12 microns; the thickness of the drift region $T_{drift}$ is substantially in the range of 0.2 to 0.5 microns; the thickness of the offset region $T_{offset}$ is substantially in the range of 0.75 to 1.0 microns; the thickness of the drift region insulating layer is substantially in the range of 2.0 to 3.0 microns; and the thickness of the offset region insulating layer is substantially in the range of 1.0 to 1.5 microns.

7. The high voltage, semiconductor-on-insulator electronic device of claim 5, wherein the substantially linear doping profile of the semiconductor layer is described at any point X microns distant from the body region by the relationship:

$$Q(X)=Q(0)+(X/(L+D))Q_{max}$$

where Q(0) is the minimum number of dopant ions per unit area in the offset region adjacent to the body region, and $Q_{max}$ is the maximum number of dopant ions per unit area implanted in the drift region.

8. The high voltage, semiconductor-on-insulator electronic device of claim 7, wherein Q(0) is substantially in the range of $6\times10^{11}/cm^2$ to about $1.5\times10^{12}/cm^2$; and $Q_{max}$ is substantially in the range of $1.4\times10^{13}/cm^2$ to about $3.4\times10^{13}/cm^2$.

9. The device of claim 5, wherein the offset region insulating layer has a thickness up to about one-half the thickness of the drift region insulating layer, the offset region insulating layer has a thickness up to about one-half the thickness of the drift region insulating layer.

* * * * *